US012648283B2

(12) United States Patent
Park et al.

(10) Patent No.: US 12,648,283 B2
(45) Date of Patent: Jun. 2, 2026

(54) DISPLAY APPARATUS

(71) Applicant: LG Display Co., Ltd., Seoul (KR)

(72) Inventors: Hyoungsun Park, Seoul (KR);
Seongsoo Cho, Seoul (KR); **Hyunseok
Na, Hwaseong-si (KR); Jongsoo Han**,
Paju-si (KR); Sanghak Shin, Paju-si
(KR); Pyungho Choi, Seoul (KR);
Hyunchyol Shin, Seoul (KR)

(73) Assignee: LG Display Co., Ltd., Seoul (KR)

( * ) Notice: Subject to any disclaimer, the term of this
patent is extended or adjusted under 35
U.S.C. 154(b) by 310 days.

(21) Appl. No.: 18/451,824

(22) Filed: Aug. 17, 2023

(65) Prior Publication Data

US 2024/0222417 A1    Jul. 4, 2024

(30) Foreign Application Priority Data

Dec. 29, 2022    (KR) ........................ 10-2022-0188847

(51) Int. Cl.
H10H 29/10        (2025.01)
H10H 20/814        (2025.01)
H10P 14/40        (2026.01)
H10P 14/692        (2026.01)
H10P 95/00        (2026.01)

(52) U.S. Cl.
CPC .......... H10H 29/10 (2025.01); H10H 20/814
(2025.01); H10P 14/418 (2026.01); **H10P
14/69215 (2026.01); H10P 14/6928** (2026.01);
H10P 14/69391 (2026.01); H10P 95/04
(2026.01)

(58) Field of Classification Search
CPC ............ H10H 20/814; H01L 21/02178; H01L
21/28568; H01L 25/167
See application file for complete search history.

(56) References Cited

U.S. PATENT DOCUMENTS

| 9,178,123 | B2 | 11/2015 | Sakariya et al. |
| 10,546,796 | B2 | 1/2020 | Hu et al. |
| 11,984,547 | B2 | 5/2024 | Shimizu |
| 2014/0159064 | A1 | 6/2014 | Sakariya et al. |
| 2014/0374908 | A1 | 12/2014 | Koezuka et al. |

(Continued)

FOREIGN PATENT DOCUMENTS

| CN | 114975722 A | 8/2022 |
| EP | 3828937 A1 | 6/2021 |

(Continued)

OTHER PUBLICATIONS

Japan Patent Office, Office Action, Japanese Patent Application No.
2023-197415, Dec. 3, 2024, eight pages.

(Continued)

*Primary Examiner* — Edward Chin
(74) *Attorney, Agent, or Firm* — Fenwick & West LLP

(57)    ABSTRACT

Disclosed is a display apparatus including a substrate; an
insulating layer disposed on the substrate; a wiring layer
disposed on the insulating layer; and a side surface protec-
tive layer disposed on a side surface of the wiring layer and
having an electrical insulation property, wherein the wiring
layer has a stack structure in which a plurality of layers are
stacked. In this regard, the side surface protective layer
covers a side surface of each of at least some of the plurality
of layers of the stack structure.

17 Claims, 9 Drawing Sheets

(56) References Cited

U.S. PATENT DOCUMENTS

| | | | | |
|---|---|---|---|---|
| 2016/0013167 A1* | 1/2016 | Sakariya | ............. | H01L 25/0753 |
| | | | | 257/88 |
| 2016/0056204 A1* | 2/2016 | Sakariya | .............. | H10D 86/441 |
| | | | | 257/88 |
| 2019/0115274 A1 | 4/2019 | Hu et al. | | |
| 2019/0123250 A1* | 4/2019 | Li | ........................ | H10H 20/854 |
| 2019/0348582 A1 | 11/2019 | Huang | | |
| 2021/0066564 A1 | 3/2021 | Kanaya | | |
| 2021/0280746 A1 | 9/2021 | Kim et al. | | |
| 2021/0343911 A1 | 11/2021 | Watanabe et al. | | |
| 2021/0359182 A1 | 11/2021 | Cao et al. | | |
| 2022/0045250 A1 | 2/2022 | Shimizu | | |
| 2022/0367775 A1 | 11/2022 | Yamazaki et al. | | |
| 2022/0393087 A1 | 12/2022 | Zeng et al. | | |
| 2024/0079527 A1* | 3/2024 | Lee | .................... | H10H 20/8312 |

FOREIGN PATENT DOCUMENTS

| | | | | | | |
|---|---|---|---|---|---|---|
| EP | 4080574 | A1 | | 10/2022 | | |
| JP | 2016503958 | A | * | 2/2016 | ........... | H01L 25/167 |
| JP | 2019-24124 | A | | 2/2019 | | |
| KR | 20160010537 | A | * | 1/2016 | ........... | H01L 25/165 |
| KR | 10-2159873 | B1 | | 10/2020 | | |
| TW | 202137543 | A | | 10/2021 | | |
| WO | WO 2020/137342 | A1 | | 7/2020 | | |
| WO | WO 2021/203415 | A1 | | 10/2021 | | |

OTHER PUBLICATIONS

Taiwan Intellectual Property Office, Office Action, Taiwanese Patent Application No. 112138086, Jun. 14, 2024, 13 pages.
European Patent Office, Extended European Search Report, European Patent Application No. 23193006.6, Feb. 9, 2024, seven pages.

* cited by examiner

100

100-1

BM     ED1     ED2     ED3

160a
160b
155

5
5
6     6

155  151     170  167'     176

Y
Z     X 100-1

100-2

DISPLAY APPARATUS

CROSS-REFERENCE TO RELATED APPLICATION

This application claims priority from Korean Patent Application No. 10-2022-0188847 filed on Dec. 29, 2022 in the Korean Intellectual Property Office, and all the benefits accruing therefrom under 35 U.S.C. 119, the contents of which in its entirety are herein incorporated by reference.

BACKGROUND

Field

The present disclosure relates to a display apparatus. More specifically, the present disclosure relates to a display apparatus in which a side surface of a wiring may be protected and light-emission efficiency of a light-emitting element may be improved.

Description of Related Art

Flat panel display apparatuses may include liquid crystal display apparatuses, and organic light-emitting display apparatuses.

The organic light-emitting display apparatus has advantages such as improved luminous efficiency, fast response speed, and wide viewing angle compared to the liquid crystal display apparatus. However, the organic light-emitting display apparatus still has low luminous efficiency, and contains an organic material, and thus is vulnerable to moisture, and thus, reliability and lifespan thereof may deteriorate.

Recently, a micro light-emitting diode display apparatus as an inorganic light-emitting display apparatus has been proposed.

In the micro light-emitting diode display apparatus, an inorganic light-emitting diode with a size of 100 micrometers or smaller is disposed in each pixel to display an image. In the micro light-emitting diode display apparatus, a process of transferring a micro light-emitting diode grown on a single crystal substrate to an array substrate of the display apparatus using a stamp or the like is performed.

SUMMARY

Pixel driving circuits and wiring layers are formed on a substrate of the display apparatus. Thus, the array substrate is prepared. Then, the micro light-emitting diode is transferred thereto.

The wiring layer as a topmost layer of the array substrate of the display apparatus may be exposed to various manufacturing processes until the micro light-emitting diodes are transferred to the array substrate. Thus, a side surface of the wiring layer is corroded or damaged due to solutions used in the various manufacturing processes.

Accordingly, the inventors of the present disclosure have invented a display apparatus in which the side surface of the wiring layer formed as the topmost layer of the array substrate may be protected.

A technical purpose according to an embodiment of the present disclosure is to provide a display apparatus in which a side surface of an uppermost wiring of an array substrate may be protected and light-emission efficiency of a light-emitting element may be improved.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims or combinations thereof.

A display apparatus according to one embodiment of the present disclosure includes a substrate; an insulating layer disposed on the substrate; a wiring layer disposed on the insulating layer; and a side surface protective layer disposed on a side surface of the wiring layer and having an electrical insulation property, wherein the wiring layer has a stack structure in which a plurality of layers are stacked, wherein the side surface protective layer covers side surfaces of at least some of the plurality of layers of the stack structure.

A display apparatus according to another embodiment of the present disclosure includes a substrate; an insulating layer disposed on the substrate; a bank disposed on the insulating layer; a wiring layer disposed on the bank; and a side surface protective layer disposed on a side surface of the wiring layer and a side surface of the bank, wherein the side surface protective layer has an electrical insulation property, wherein the wiring layer has a stack structure in which a plurality of layers are stacked, wherein the side surface protective layer covers side surfaces of at least some of the plurality of layers of the stack structure.

Details of other embodiments are included in the detailed descriptions and drawings.

According to the embodiments of the present disclosure, the reflective opening is defined in the contact wiring layer disposed under the light-emitting element so as to expose a reflective metal layer of the contact wiring layer. Thus, the light-emission efficiency of the light-emitting element may be improved. Accordingly, the display apparatus can operate at a low power level.

According to the embodiments of the present disclosure, the side surface protective layer is disposed on the side surface of the contact wiring layer, such that some of the layers constituting the contact wiring layer may be prevented from being corroded or damaged by exposure to solutions used in subsequent manufacturing processes.

According to the embodiments of the present disclosure, the reflective layer made of aluminum (Al) or silver (Ag) having high visible-light reflectance may be disposed under the light-emitting element. Thus, the light-emission efficiency of the light-emitting element may be improved. Accordingly, the display apparatus can operate at a low power level. Moreover, photolithography and etching processes for forming the reflective opening in the contact wiring layer are not required, such that a manufacturing process may be simplified and a manufacturing cost may be reduced.

In another embodiment, a display apparatus comprises a substrate, an insulating layer disposed on the substrate, a first wiring layer disposed on the insulating layer, a light-emitting diode mounted on and electrically connected to the first wiring layer, and a side surface protective layer disposed directly on at least a part of a side surface of the first wiring layer and having an electrical insulation property.

Effects of the present disclosure are not limited to the effects mentioned above, and other effects not mentioned will be clearly understood by those skilled in the art from the descriptions below.

DETAILED DESCRIPTIONS

Figure 1:
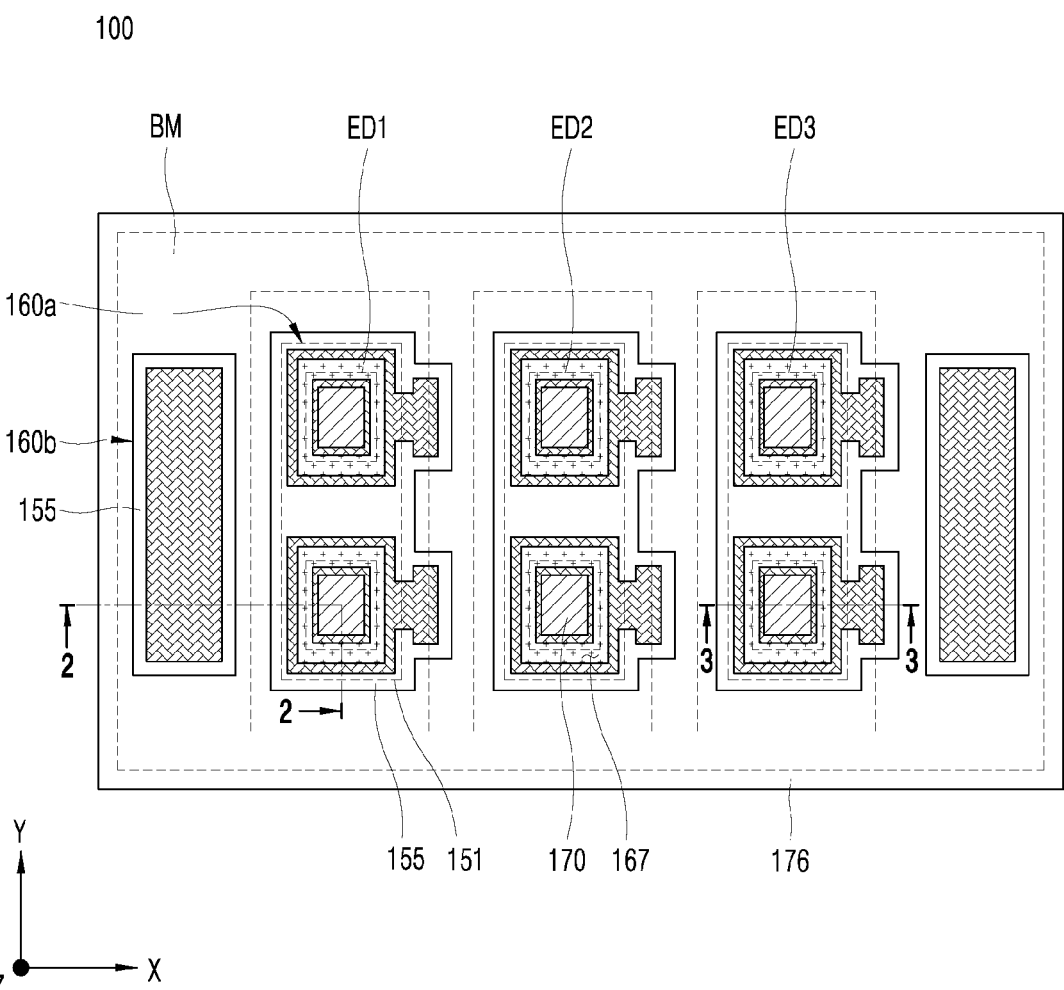
FIG. 1 is a plan view illustrating a display apparatus according to an embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which the present disclosure belongs.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, display apparatuses according to embodiments according to the present disclosure will be described in detail with reference to the accompanying drawings.

Figure 2:
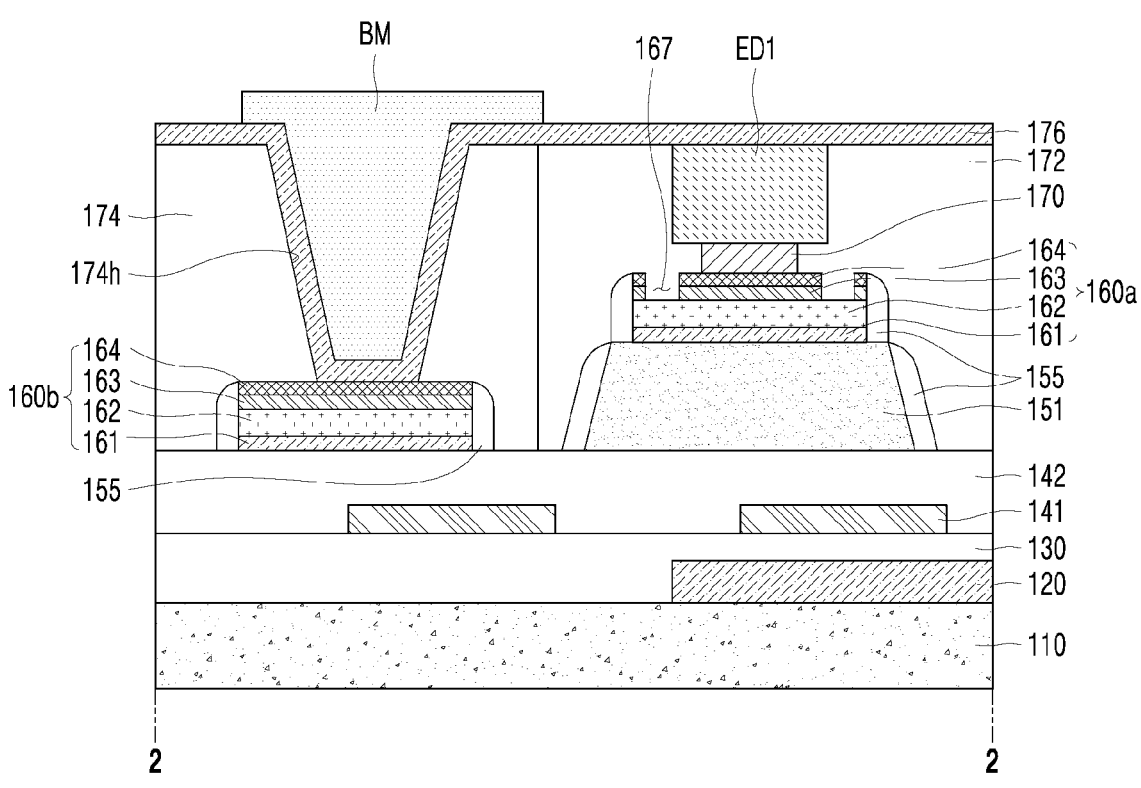
FIG. 2 is a cross-sectional view taken along a line 2-2 in FIG. 1.
Figure 3:
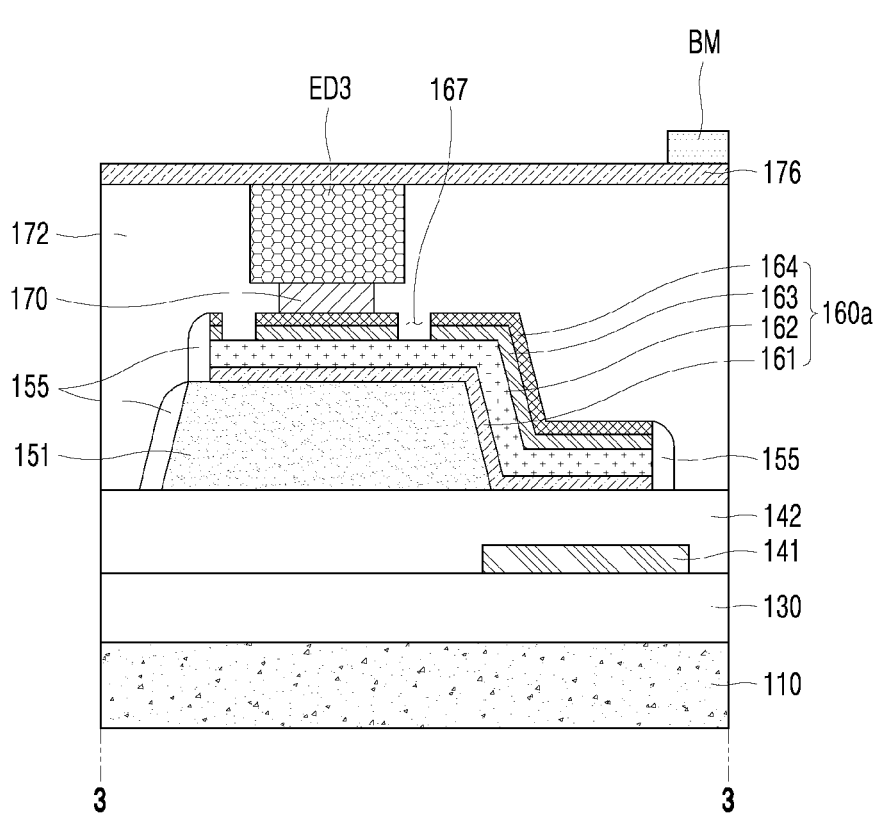
FIG. 3 is a cross-sectional view taken along a line 3-3 in FIG. 1.

FIG. 1 is a plan view showing a display apparatus 100 according to an embodiment of the present disclosure. FIG. 2 is a cross-sectional view taken along a line 2-2 in FIG. 1. FIG. 3 is a cross-sectional view taken along a line 3-3 in FIG. 1. FIG. 1 to FIG. 3 shows one pixel disposed in a display area of the display apparatus 100.

Referring to FIG. 1 to FIG. 3, the display apparatus 100 may include a pixel driving circuit 120, a first planarization layer 130, a connection wiring layer 141, an insulating layer 142, a bank 151, a first contact wiring layer 160a, a second contact wiring layer 160b, a side surface protection layer 155, a solder 170, light-emitting elements ED1, ED2, and ED3, a diffusion insulating layer 172, a second planarization layer 174, a common electrode 176, and a black matrix BM, which are disposed on a substrate 110.

The substrate 110 may be made of plastic having flexibility. For example, the substrate 110 may be composed of a single layer or a stack of multiple layers made of polyimide, polyethylene terephthalate, polyethylene naphthalate, polycarbonate, polyethersulfone, polyarylate, polysulfone, or cyclic-olefin copolymer, etc. However, the present disclosure may but is not limited thereto. The substrate 110 may be made of glass.

The pixel driving circuit 120 may be disposed on the substrate 110.

The pixel driving circuit 120 may include a plurality of thin-film transistors using an amorphous silicon semiconductor, a polycrystalline silicon semiconductor, or an oxide semiconductor and at least one storage capacitor. The plurality of thin-film transistors may include at least one driving thin-film transistor, and at least one switching thin-film transistor. When the pixel driving circuit 120 includes the plurality of thin-film transistors, the plurality of thin-film transistors may be formed on the substrate 110 using a TFT manufacturing process.

The pixel driving circuit 120 may be a pixel driver chip manufactured on a single crystal semiconductor substrate using a MOSFET manufacturing process. The pixel driver chip may include a plurality of circuit units, and each circuit unit may include at least one driving transistor, at least one switching transistor, and at least one storage capacitor. When the pixel driving circuit 120 is a pixel driver chip, an adhesive layer is disposed on the substrate 110, and then the pixel driving circuit 120 may be mounted on the adhesive layer in a transfer process. The adhesive layer may be made of acryl resin, silicone resin, etc. However, the present disclosure is not limited thereto.

The first planarization layer 130 covering the pixel driving circuit 120 may be disposed on the substrate 110. The first planarization layer 130 may be made of an organic insulating material, for example, photosensitive photo acryl or photosensitive polyimide. However, the present disclosure is not limited thereto.

At least one connection wiring layer 141 and at least one insulating layer 142 may be disposed on the first planarization layer 130. Although one connection wiring layer 141 and one insulating layer 142 are shown in FIG. 2 and FIG.

3 by way of example, a plurality of connection wiring layers and a plurality of insulating layers may be stacked on the first planarization layer 130.

The connection wiring layer 141 may have a single-layer or multi-layer structure made of aluminum (Al), titanium (Ti), copper (Cu), molybdenum (Mo), tantalum (Ta), titanium nitride (TiN), tantalum nitride (TaN), or the like. For example, the connection wiring layer 141 may have a stacked 3-layer structure such as Ti/Al/Ti layers or Mo/Al/Mo layers.

The insulating layer 142 may be made of an organic insulating material such as photosensitive photo acryl or photosensitive polyimide. However, the present disclosure is not limited thereto. The insulating layer 142 may be composed of a single layer or a stack of multiple layers made of an inorganic insulating material such as silicon oxide, silicon nitride, silicon oxynitride, or aluminum oxide. However, the present disclosure is not limited thereto.

A plurality of banks 151 may be disposed on the insulating layer 142.

When one pixel includes three sub-pixels, for example, a red sub-pixel, a green sub-pixel, and a blue sub-pixel, three banks 151 may be disposed in one pixel. The number of the banks 151 arranged in one pixel may be equal to the number of sub-pixels included in one pixel. The bank 151 may be made of an organic insulating material such as photosensitive photo acryl or photosensitive polyimide. However, the present disclosure is not limited thereto.

At least one first contact wiring layer 160a may be disposed on the bank 151. For example, two first contact wiring layers 160a may be disposed on one bank 151. For example, two first contact wiring layers 160a may be disposed in each sub-pixel.

The first contact wiring layer 160a may be disposed on a side surface of the bank 151 and an upper surface of the insulating layer 142 and may extend in one direction, for example, in an X-axis direction so as to have a predetermined length.

The first contact wiring layer 160a may have a multi-layer structure including a first layer 161, a second layer 162, a third layer 163, and a fourth layer 164. Each of the first layer 161 and the third layer 163 may include titanium (Ti) or molybdenum (Mo). The second layer 162 may include aluminum (Al). The fourth layer 164 may include a transparent conductive oxide layer such as indium tin oxide (ITO) or indium zinc oxide (IZO) which has good adhesiveness with the solder 170 and has corrosion and acid resistance.

The first contact wiring layer 160a may be formed on the bank 151 by sequentially depositing the first layer 161, the second layer 162, the third layer 163, and the fourth layer 164, and then performing a photolithography process and an etching process thereon.

The first contact wiring layer 160a may have a reflective opening 167 defined therein for exposing the second layer 162 made of aluminum having high visible-light reflectivity. The reflective opening 167 may have a ring shape in a plan view. After the first contact wiring layer 160a is formed on the bank 151, the reflective opening 167 may be formed therein by additionally removing the fourth layer 164 and the third layer 163 in a ring shape by a photolithography process and an etching process. Each of the fourth layer 164 and the third layer 163 may be divided into two areas spaced from each other via the reflective opening 167. Each of the fourth layer 164 and the third layer 163 may be divided into a central area on which the solder 170 is disposed, and an outer area surrounding the central area.

Each of the light-emitting elements ED1, ED2, and ED3 may be disposed on the first contact wiring layer 160*a*. The reflective opening 167 may be disposed under each of the light-emitting elements ED1, ED2, and ED3 such that the light-emission efficiency of each of the light-emitting elements ED1, ED2, and ED3 may be improved.

The second contact wiring layers 160*b* may be disposed on the insulating layer 142 and in an area on which the bank 151 is not disposed. For example, the second contact wiring layer 160*b* may be disposed at each of both opposing sides of each pixel.

The second contact wiring layers 160*b* may be simultaneously formed in the same process as a process of forming the first contact wiring layers 160*a*. In a similar manner to the first contact wiring layer 160*a*, the second contact wiring layer 160*b* may have a multi-layer structure including the first layer 161, the second layer 162, the third layer 163, and the fourth layer 164. Each of the first layer 161 and the third layer 163 may include titanium (Ti) or molybdenum (Mo). The second layer 162 may include aluminum (Al). The fourth layer 164 may include a transparent conductive oxide layer such as indium tin oxide (ITO) or indium zinc oxide (IZO) which is corrosion resistant and acid resistant.

The side surface protection layer 155 may be disposed on all side surfaces of each of the first contact wiring layers 160*a* and the second contact wiring layers 160*b*. In some embodiments, the side surface protection layer 155 may cover side surfaces of all layers of each of the first contact wiring layer 160*a* and the second contact wiring layer 160*b*. In other embodiments, the side surface protection layer 155 may cover side surfaces of at least some layers of each of the first contact wiring layer 160*a* and the second contact wiring layer 160*b*. For example, side surfaces of the first layer 161 and the second layer 162 of each of the first contact wiring layer 160*a* and the second contact wiring layers 160*b* may be covered with the side surface protection layer 155.

In this way, the side surface protection layer 155 may be disposed on all side surfaces of each of the first contact wiring layer 160*a* and the second contact wiring layer 160*b*, thereby preventing the second layer 162 of each of the first contact wiring layers 160*a* and the second contact wiring layers 160*b* from being corroded or damaged by exposure to solutions used in subsequent manufacturing processes including a process of forming the reflective opening 167.

The side surface protection layer 155 may be disposed on side surfaces of the bank 151 as well as on the side surfaces of the first contact wiring layers 160*a*.

The side surface protection layer 155 may be made of an inorganic insulating material. The side surface protection layer 155 may include, for example, a single layer or a stack of multiple layers made of silicon oxide, silicon nitride, silicon oxynitride, or aluminum oxide. However, the present disclosure is not limited thereto.

The side surface protection layer 155 may be formed by depositing an inorganic insulating material covering the bank 151, the first contact wiring layers 160*a*, and the second contact wiring layers 160*b* and then performing an etch back process thereon, after forming the first contact wiring layers 160*a* and the second contact wiring layers 160*b* and before forming the reflective opening 167.

The solder 170 may be disposed on the first contact wiring layer 160*a*. The solder 170 may be made of indium (In), tin (Sn), or an alloy thereof.

Each of the light-emitting elements ED1, ED2, and ED3 may be mounted on the first contact wiring layer 160*a* via the solder 170. For example, one pixel may include the light-emitting elements ED1, ED2, and ED3 each emitting light of one of three colors, respectively. The first light-emitting element ED1 may be a red light-emitting element, the second light-emitting element ED2 may be a green light-emitting element, and the third light-emitting element ED3 may be a blue light-emitting element. In some embodiments, two light-emitting elements may be mounted on each bank 151. One of the two light-emitting elements disposed on the bank 151 may act as a main light-emitting element, and the other of the two light-emitting elements may act as an auxiliary light-emitting element or a redundant light-emitting element.

Each of the light-emitting elements ED1, ED2, and ED3 may be embodied as an inorganic light-emitting diode. The inorganic light-emitting diode may have a size of 1 to 100 μm, 1 to 50 μm, or 1 to 20 μm in a horizontal direction (the X-axis direction or Y-axis direction). The inorganic light-emitting diode may be referred to as a micro light-emitting diode. The inorganic light-emitting diode may include a p-doped semiconductor layer, an n-doped semiconductor layer, and an active layer (for example, one or more quantum well layers) disposed therebetween. Moreover, the inorganic light-emitting diode may include a first electrode connected to the p-doped semiconductor layer and a second electrode connected to the n-doped semiconductor layer. The inorganic light-emitting diode may be manufactured using a group II-VI or III-V compound semiconductor. The inorganic light-emitting diode may be manufactured by a separate manufacturing process and may be placed on the adhesive layer by a transfer process.

The diffusion insulating layer 172 surrounding the banks 151 and each of the light-emitting elements ED1, ED2, and ED3 may be disposed. The diffusion insulating layer 172 may be made of an organic insulating material in which scattering particles such as titanium dioxide are dispersed. When the diffusion insulating layer 172 is disposed to surround each of the light-emitting elements ED1, ED2, and ED3, the light-emission efficiency of each of the light-emitting elements ED1, ED2, and ED3 may be improved.

Moreover, the second planarization layer 174 surrounding a periphery of the diffusion insulating layer 172 may be disposed. The second planarization layer 174 may be made of an organic insulating material.

The second planarization layer 174 may have a through-hole 174*h* defined therein. The through-hole 174*h* may expose the second contact wiring 160*b*. The through-hole 174*h* may be defined in an outermost area of the pixel so as to surround the banks 151.

The common electrode 176 connected to the light-emitting elements ED1, ED2, and ED3 may be disposed on the diffusion insulating layer 172 and the second planarization layer 174. Moreover, the common electrode 176 may extend along and on an exposed surface of the through-hole 174*h* of the second planarization layer 174 so as to be in contact with the second contact wiring 160*b*.

The black matrix BM may fill the through-hole 174*h* and may be disposed in an outer area of the pixel. Moreover, the black matrix BM may be disposed on the diffusion insulating layer 172 and between the banks 151.

Figure 4:
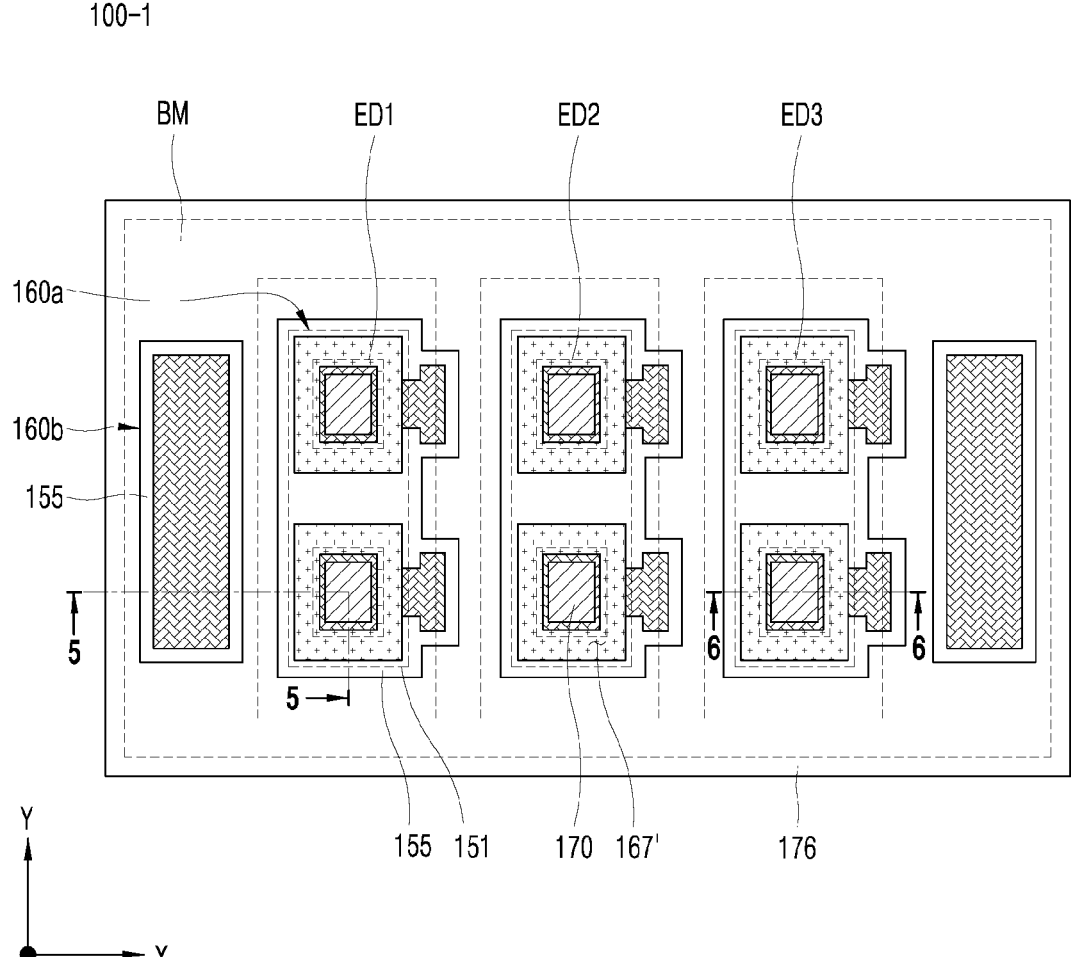
FIG. 4 is a plan view illustrating a display apparatus according to another embodiment of the present disclosure.
Figure 5:
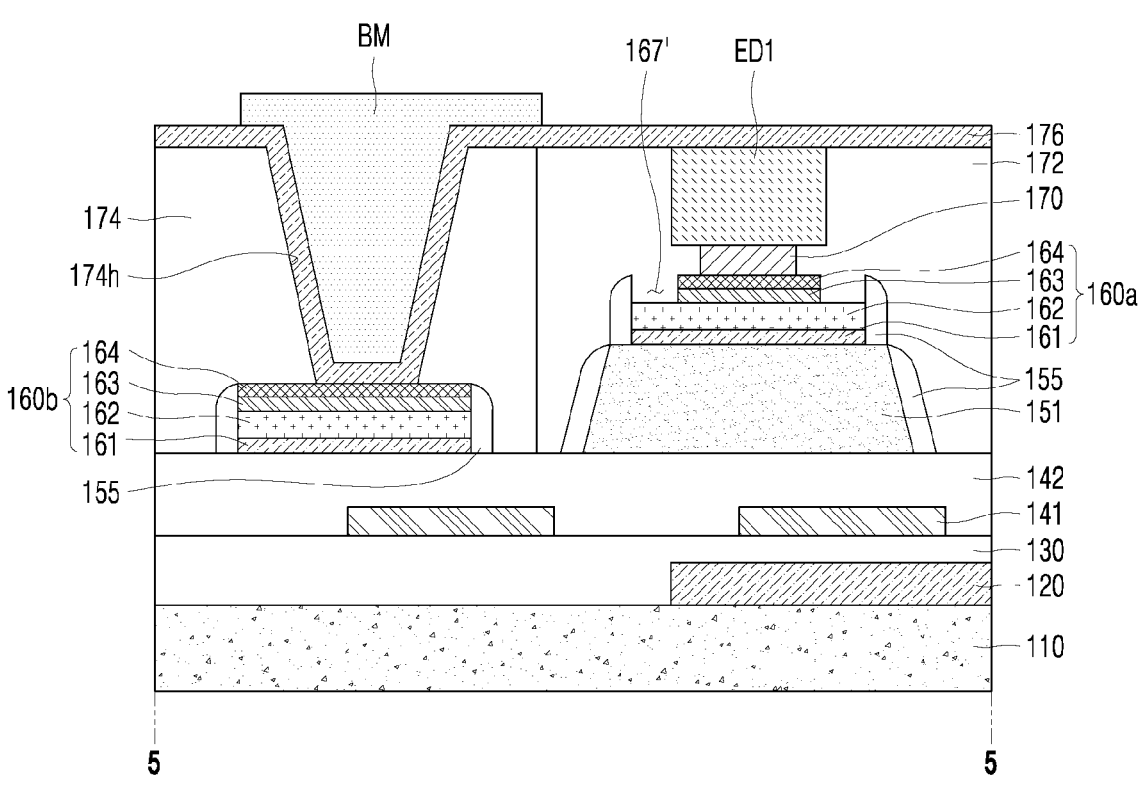
FIG. 5 is a cross-sectional view taken along a line 5-5 in FIG. 4.
Figure 6:
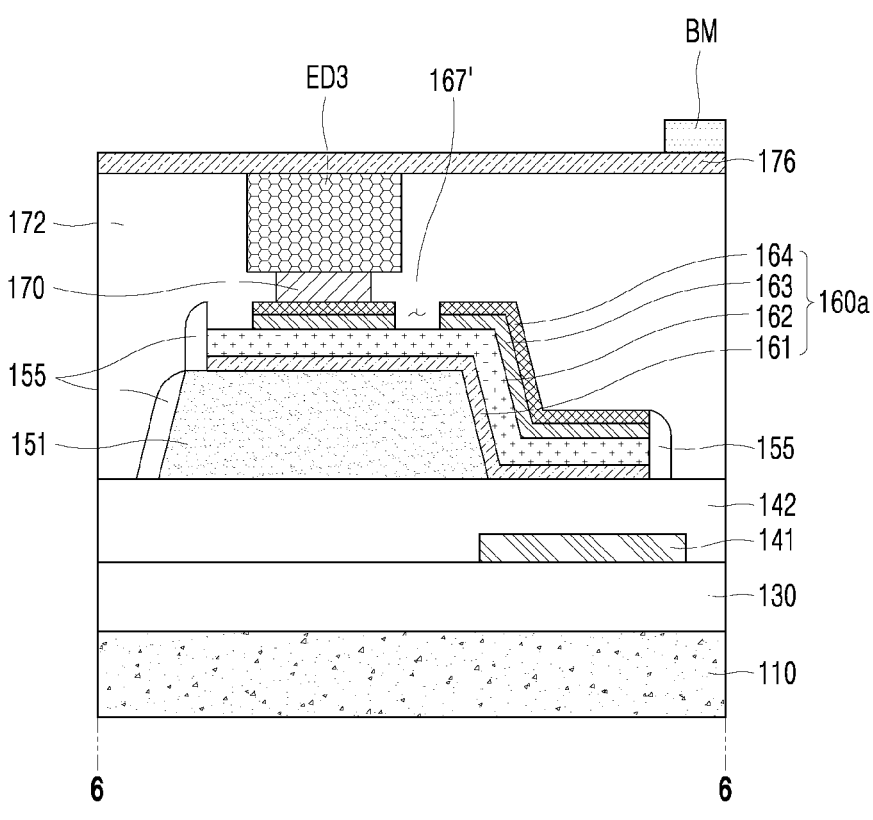
FIG. 6 is a cross-sectional view taken along a line 6-6 in FIG. 4.

FIG. 4 is a plan view showing a display apparatus 100-1 according to another embodiment of the present disclosure. FIG. 5 is a cross-sectional view taken along a line 5-5 in FIG. 4. FIG. 6 is a cross-sectional view taken along a line 6-6 in FIG. 4.

The display apparatus 100-1 as shown in FIG. 4 to FIG. 6 is similar to the display apparatus 100 as shown in FIG. 1 to FIG. 3, but differs from the display apparatus 100 as shown in FIG. 1 to FIG. 3 in that the display apparatus 100-1 includes a reflective opening 167'.

Referring to FIG. 4 to FIG. 6, the first contact wiring layer 160a may have the reflective opening 167' defined therein for exposing the second layer 162 made of aluminum (Al) having high visible-light reflectivity. The reflective opening 167' may have a ring shape in a plan view. After the first contact wiring layer 160a is formed on the bank 151, the reflective opening 167' may be formed by additionally removing the fourth layer 164 and the third layer 163 in a ring shape by a photolithography process and an etching process. The reflective opening 167' has a larger area size than an area size of the reflective opening 167 in FIG. 1 to FIG. 3 so as to expose the second layer 162. The reflective opening 167' may extend to an inner side surface of the side surface protection layer 155.

Each of the light-emitting elements ED1, ED2, and ED3 is disposed on the first contact wiring layer 160a. In this regard, the reflective opening 167' is defined under each of the light-emitting elements ED1, ED2, and ED3, such that the light-emission efficiency of each of the light-emitting elements ED1, ED2, and ED3 may be improved.

When the side surface protection layer 155 is disposed on all side surfaces of each of the first contact wiring layer 160a and the second contact wiring layer 160b, the second layer 162 of each of the first contact wiring layer 160a and the second contact wiring layer 160b may be prevented from being corroded or damaged by exposure to solutions used in subsequent manufacturing processes including a process of forming the reflective opening 167'.

Figure 7:
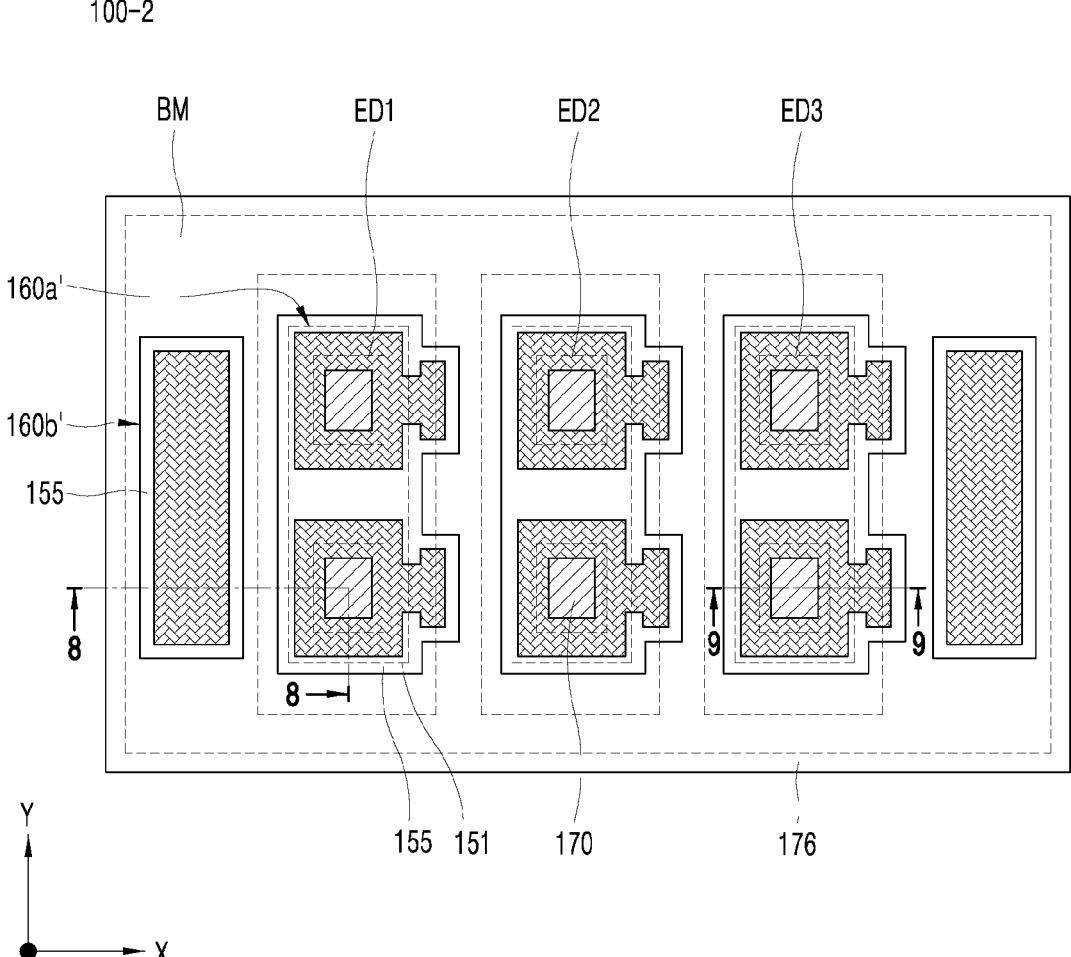
FIG. 7 is a plan view illustrating a display apparatus according to still another embodiment of the present disclosure.
Figure 8:
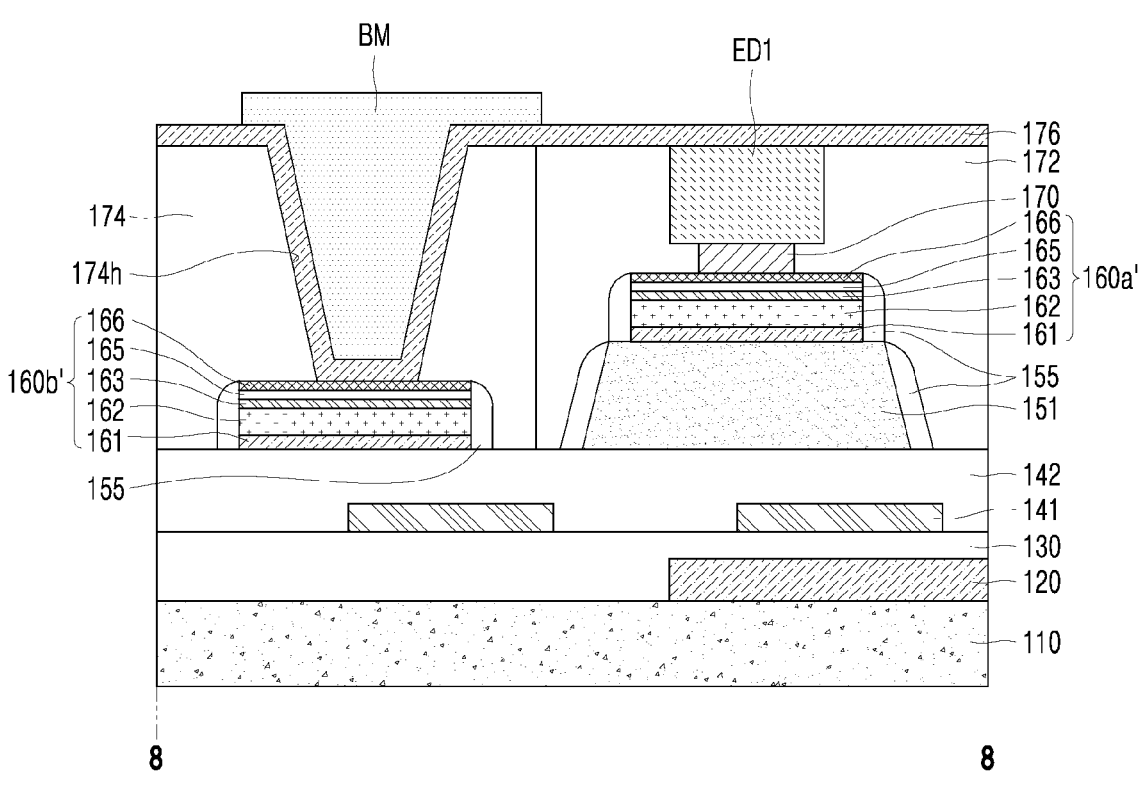
FIG. 8 is a cross-sectional view taken along a line 8-8 in FIG. 7.
Figure 9:
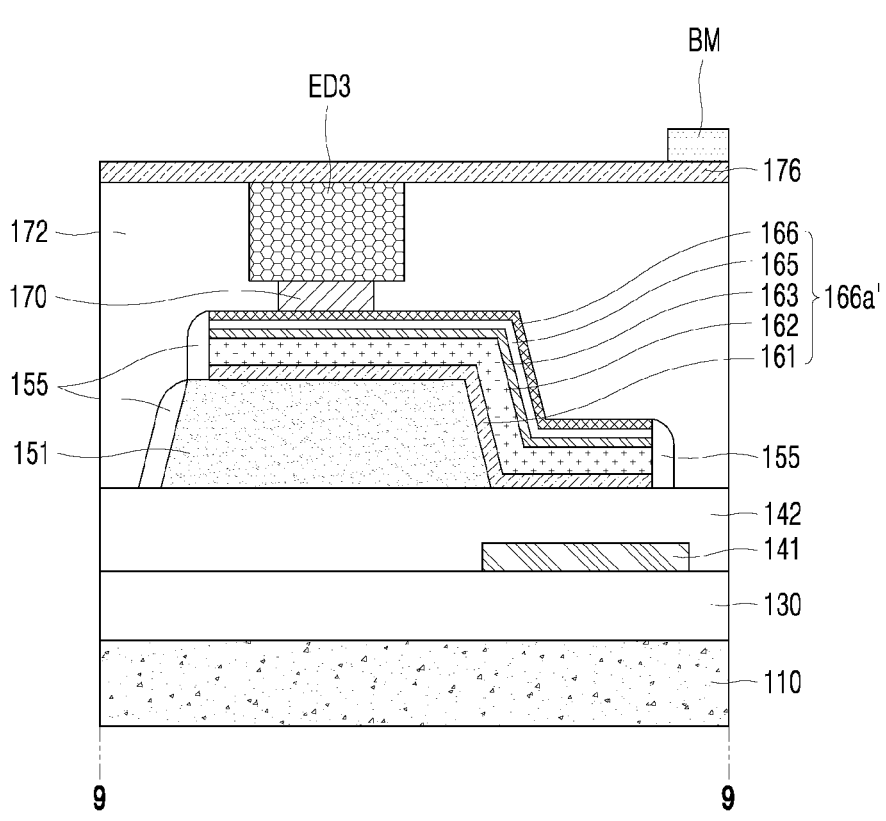
FIG. 9 is a cross-sectional view taken along a line 9-9 in FIG. 7.

FIG. 7 is a plan view showing a display apparatus 100-2 according to still another embodiment of the present disclosure. FIG. 8 is a cross-sectional view taken along a line 8-8 in FIG. 7. FIG. 9 is a cross-sectional view taken along a line 9-9 in FIG. 7.

The display apparatus 100-2 as shown in FIG. 7 to FIG. 9 is similar to the display apparatus 100 as shown in FIG. 1 to FIG. 3, but differs from the display apparatus 100 as shown in FIG. 1 to FIG. 3 in that the display apparatus 100-2 includes a first contact wiring layer 160a' and a second contact wiring layer 160b', and the first contact wiring layer 160a' does not have the reflective opening defined therein.

Referring to FIG. 7 to FIG. 9, the first contact wiring layer 160a' disposed on the bank 151 may have a multi-layer structure including the first layer 161, the second layer 162, the third layer 163, a fourth layer 165, and a fifth layer 166. Each of the first layer 161 and the third layer 163 may include titanium (Ti) or molybdenum (Mo). The second layer 162 may include aluminum (Al). The fourth layer 165 may include aluminum (Al) or silver (Ag) having high visible-light reflectance. The fifth layer 166 may include a transparent conductive oxide layer such as indium tin oxide (ITO) or indium zinc oxide (IZO) which has good adhesiveness with the solder 170 and has corrosion resistance and acid resistance.

Each of the light-emitting elements ED1, ED2, and ED3 is disposed on the first contact wiring layer 160a'. In this regard, the fourth layer 165 made of aluminum (Al) or silver (Ag) having high visible-light reflectivity may be additionally disposed under each of the light-emitting elements ED1, ED2, and ED3 such that the light-emission efficiency of each of the light-emitting elements ED1, ED2, and ED3 may be improved.

The photolithography and etching processes for forming the reflective openings in the first contact wiring layers 160a' are not required, such that a manufacturing process may be simplified and a manufacturing cost may be reduced.

The first contact wiring layer 160a' may be formed on the bank 151 by sequentially depositing the first layer 161, the second layer 162, the third layer 163, the fourth layer 165, and the fifth layer 166, and then performing a photolithography process and an etching process thereon.

The second contact wiring layer 160b' may be simultaneously formed in the same process as a process of forming the first contact wiring layer 160a'. In a similar manner to the first contact wiring layer 160a', the second contact wiring layer 160b' may have a multi-layer structure including the first layer 161, the second layer 162, the third layer 163, the fourth layer 165, and the fifth layer 166. Each of the first layer 161 and the third layer 163 may include titanium (Ti) or molybdenum (Mo). The second layer 162 may include aluminum (Al). The fourth layer 165 may include aluminum (Al) or silver (Ag) having high visible-light reflectance. The fifth layer 166 may include a transparent conductive oxide layer such as indium tin oxide (ITO) or indium zinc oxide (IZO) which has good adhesiveness with the solder 170 and has corrosion resistance and acid resistance.

The side surface protection layer 155 may be disposed on all side surfaces of each of the first contact wiring layers 160a' and the second contact wiring layers 160b'. In some embodiments, the side surface protection layer 155 may cover side surfaces of all layers of each of the first contact wiring layers 160a' and the second contact wiring layers 160b'. In other embodiments, the side surface protection layer 155 may cover side surfaces of at least some layers of each of the first contact wiring layers 160a' and the second contact wiring layers 160b'. For example, the side surfaces of each of the first layer 161 and the second layer 162 of each of the first contact wiring layers 160a' and the second contact wiring layers 160b' may be covered with the side surface protection layer 155.

In this way, the side surface protection layer 155 may be disposed on all side surfaces of each of the first contact wiring layers 160a and the second contact wiring layers 160b, such that the second layer 162 of each of the first contact wiring layers 160a' and the second contact wiring layers 160b' may be prevented from being corroded or damaged by exposure to solutions used in subsequent processes.

The side surface protection layer 155 may be disposed on the side surfaces of the bank 151 as well as on the side surfaces of the first contact wiring layer 160a.

A display apparatus according to embodiments of the present disclosure may be described as follows.

A first aspect of the present disclosure provides a display apparatus comprising: a substrate; an insulating layer disposed on the substrate; a wiring layer disposed on the insulating layer; and a side surface protective layer disposed on a side surface of the wiring layer and having an electrical insulation property, wherein the wiring layer has a stack structure in which a plurality of layers are stacked, wherein the side surface protective layer covers side surfaces of at least some of the plurality of layers of the stack structure.

In some implementations of the first aspect, the side surface protective layer includes an inorganic insulating material.

In some implementations of the first aspect, the side surface protective layer is composed of a single layer or multiple layers made of silicon oxide, silicon nitride, silicon oxynitride or aluminum oxide.

In some implementations of the first aspect, the stack structure includes a first layer, a second layer, a third layer and a fourth layer sequentially stacked on the insulating layer, wherein each of the first layer and the third layer includes titanium or molybdenum, wherein the second layer includes aluminum, wherein the fourth layer includes transparent conductive oxide.

In some implementations of the first aspect, the side surface protective layer covers side surfaces of at least the first layer and the second layer, In some implementations of the first aspect, the side surface protective layer covers side surfaces of the first to fourth layers.

In some implementations of the first aspect, the wiring layer has a reflective opening defined therein in a ring shape in a plan view of the apparatus, wherein the reflective opening is formed by partially removing the third layer and the fourth layer so as to expose the second layer.

In some implementations of the first aspect, the display apparatus further includes: a solder disposed on the wiring layer and in an area surrounded with the reflective opening defined in the wiring layer; and a light-emitting element mounted on the wiring layer via the solder disposed therebetween.

In some implementations of the first aspect, the display apparatus further includes a bank disposed between the insulating layer and the wiring layer, wherein the bank is made of an insulating material, wherein the wiring layer is disposed on a top surface of the bank, wherein the side surface protective layer is disposed on a side surface of the bank.

In some implementations of the first aspect, the stack structure includes a first layer, a second layer, a third layer, a fourth layer, and a fifth layer sequentially stacked on the insulating layer, wherein each of the first layer and the third layer includes titanium or molybdenum, wherein the second layer includes aluminum, wherein the fourth layer includes aluminum or silver, wherein the fifth layer includes transparent conductive oxide.

In some implementations of the first aspect, the display apparatus further includes: a solder disposed on a top surface of the fifth layer of the wiring layer; and a light-emitting element mounted on the wiring layer via the solder disposed therebetween.

A second aspect of the present disclosure provides a display apparatus comprising: a substrate; an insulating layer disposed on the substrate; a bank disposed on the insulating layer; a wiring layer disposed on the bank; and a side surface protective layer disposed on a side surface of the wiring layer and a side surface of the bank, wherein the side surface protective layer has an electrical insulation property, wherein the wiring layer has a stack structure in which a plurality of layers are stacked, wherein the side surface protective layer covers side surfaces of at least some of the plurality of layers of the stack structure.

In some implementations of the second aspect, the side surface protective layer includes an inorganic insulating material.

In some implementations of the second aspect, the stack structure includes a first layer, a second layer, a third layer and a fourth layer sequentially stacked on the insulating layer, wherein each of the first layer and the third layer includes titanium or molybdenum, wherein the second layer includes aluminum, wherein the fourth layer includes transparent conductive oxide.

In some implementations of the second aspect, the side surface protective layer covers side surfaces of at least the first layer and the second layer, In some implementations of the second aspect, the side surface protective layer covers side surfaces of the first to fourth layers.

In some implementations of the second aspect, the wiring layer has a reflective opening defined therein in a ring shape in a plan view of the apparatus, wherein the reflective opening is formed by partially removing the third layer and the fourth layer so as to expose the second layer.

In some implementations of the second aspect, the display apparatus further includes: a solder disposed on the wiring layer and in an area surrounded with the reflective opening defined in the wiring layer; and a light-emitting element mounted on the wiring layer via the solder disposed therebetween.

In some implementations of the second aspect, the stack structure includes a first layer, a second layer, a third layer, a fourth layer, and a fifth layer sequentially stacked on the insulating layer, wherein each of the first layer and the third layer includes titanium or molybdenum, wherein the second layer includes aluminum, wherein the fourth layer includes aluminum or silver, wherein the fifth layer includes transparent conductive oxide.

In some implementations of the second aspect, the display apparatus further includes: a solder disposed on a top surface of the fifth layer of the wiring layer; and a light-emitting element mounted on the wiring layer via the solder disposed therebetween.

In another implementation, a display apparatus comprises a substrate, an insulating layer disposed on the substrate, a first wiring layer disposed on the insulating layer, a light-emitting diode mounted on and electrically connected to the first wiring layer, and a side surface protective layer disposed directly on at least a part of a side surface of the first wiring layer and having an electrical insulation property.

Although the embodiments of the present disclosure have been described in more detail with reference to the accompanying drawings, the present disclosure is not necessarily limited to these embodiments, and may be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

What is claimed is:

1. A display apparatus comprising:
   a substrate;
   an insulating layer disposed on the substrate;
   a first wiring layer disposed on the insulating layer;
   a light-emitting diode mounted on and electrically connected to the first wiring layer; and
   a side surface protective layer disposed directly on at least a part of a side surface of the first wiring layer and having an electrical insulation property,
   wherein the first wiring layer includes a first conductive layer, a second conductive layer, a third conductive layer and a fourth conductive layer sequentially stacked on the insulating layer, and
   wherein the side surface protective layer covers a side surface of each of the first to fourth conductive layers of the first wiring layer.

2. The display apparatus of claim 1, wherein the side surface protective layer includes an inorganic insulating material.

3. The display apparatus of claim 1, wherein the side surface protective layer includes a single layer or multiple layers made of silicon oxide, silicon nitride, silicon oxynitride or aluminum oxide.

4. The display apparatus of claim 1,
wherein each of the first layer and the third layer includes
titanium or molybdenum,
wherein the second layer includes aluminum, and
wherein the fourth layer includes transparent conductive
oxide.

5. The display apparatus of claim 4, wherein the side
surface protective layer is disposed directly on side surfaces
of the first conductive layer and the second conductive layer
of the first wiring layer.

6. The display apparatus of claim 4, wherein the first
wiring layer has a reflective opening defined therein in a ring
shape in a plan view of the display apparatus,
wherein the third conductive layer and the fourth conduc-
tive layer of the first wiring layer are partially removed
in the reflective opening so as to expose a top surface
of the second conductive layer.

7. The display apparatus of claim 6, wherein the side
surface protective layer is disposed directly on side surfaces
of the first conductive layer and the second conductive layer
of the first wiring layer, but is separated from side surfaces
of the third conductive layer and the fourth conductive layer
of the first wiring layer by the reflective opening.

8. The display apparatus of claim 6, further comprising a
solder layer disposed on the first wiring layer and in an area
surrounded by the reflective opening defined in the first
wiring layer, the light-emitting diode electrically connected
to the first wiring layer via the solder layer disposed between
the first wiring layer and the light-emitting diode.

9. The display apparatus of claim 1, further comprising a
bank disposed between the insulating layer and the first
wiring layer, the bank made of an insulating material,
wherein the first wiring layer is disposed on a top surface
of the bank, and
wherein the side surface protective layer is disposed
directly on a side surface of the bank.

10. The display apparatus of claim 1, wherein the first
wiring layer includes the first conductive layer, the second
conductive layer, the third conductive layer, the fourth
conductive layer, and a fifth conductive layer sequentially
stacked on the insulating layer,
wherein each of the first conductive layer and the third
conductive layer includes titanium or molybdenum, wherein the second conductive layer includes aluminum,
wherein the fourth conductive layer includes aluminum or
silver, and
wherein the fifth conductive layer includes transparent
conductive oxide.

11. The display apparatus of claim 10, wherein the side
surface protective layer is disposed directly on side surfaces
of each of the first conductive layer, the second conductive
layer, the third conductive layer, the fourth conductive layer,
and the fifth conductive layer of the first wiring layer.

12. The display apparatus of claim 10, further comprising
a solder layer disposed on a top surface of the fifth conduc-
tive layer of the first wiring layer, the light-emitting diode
electrically connected to the first wiring layer via the solder
layer disposed between the fifth conductive layer and the
light-emitting diode.

13. The display apparatus of claim 1, further comprising:
a second wiring layer disposed on the insulating layer, and
another side surface protective layer disposed directly on
a side surface of the second wiring layer and having the
electrical insulation property.

14. The display apparatus of claim 13, further comprising:
a diffusion insulating layer covering the first wiring layer;
a planarization layer covering the second wiring layer, the
planarization layer including an opening exposing a
part of a top surface of the second wiring layer; and
a common electrode disposed on the light-emitting diode,
the planarization layer, and the exposed part of the top
surface of the second wiring layer to electrically con-
nect the second wiring layer to the light-emitting diode.

15. The display apparatus of claim 1, wherein the side
surface protective layer does not overlap with a black matrix
in a plan view of the display apparatus.

16. The display apparatus of claim 13, wherein:
the side surface protective layer does not overlap with a
black matrix in a plan view of the display apparatus;
and
the another side surface protective layer overlaps with a
black matrix in a plan view of the display apparatus.

17. The display apparatus of claim 1, wherein the side
surface protective layer does not cover a top surface of the
first wiring layer.

* * * * *